(12) United States Patent  
Ferndahl et al.

(10) Patent No.: US 9,024,703 B2  
(45) Date of Patent: May 5, 2015

(54) SIGNAL DIRECTING MEANS FOR DIVIDING AN INPUT SIGNAL INTO AT LEAST TWO OUTPUT SIGNALS OR COMBINING AT LEAST TWO INPUT SIGNALS INTO ONE OUTPUT SIGNAL

(75) Inventors: Mattias Ferndahl, Göteborg (SE); Hans-Olof Vickes, Särö (SE)

(73) Assignee: SAAB AB, Linkoping (SE)

( * ) Notice: Subject to any disclaimer, the term of this patent is extended or adjusted under 35 U.S.C. 154(b) by 0 days.

(21) Appl. No.: 14/006,067

(22) PCT Filed: Mar. 24, 2011

(86) PCT No.: PCT/SE2011/050331  
§ 371 (c)(1),  
(2), (4) Date: Oct. 18, 2013

(87) PCT Pub. No.: WO2012/128686  
PCT Pub. Date: Sep. 27, 2012

(65) Prior Publication Data  
US 2014/0035652 A1    Feb. 6, 2014

(51) Int. Cl.  
*H03H 7/38*  (2006.01)  
*H03L 5/00*  (2006.01)  
(Continued)

(52) U.S. Cl.  
CPC  *H03F 3/602* (2013.01); *H01P 5/16* (2013.01); *H03F 3/605* (2013.01)

(58) Field of Classification Search  
USPC .......... 327/306, 308, 333; 333/109, 110, 116, 333/131, 125–126, 117, 33; 330/54  
See application file for complete search history.

(56) References Cited

U.S. PATENT DOCUMENTS

| | | |
|---|---|---|
| 4,769,618 A | 9/1988 | Parish et al. |
| 5,021,743 A * | 6/1991 | Chu et al. .......... 330/54 |

(Continued)

FOREIGN PATENT DOCUMENTS

| | | |
|---|---|---|
| DE | 102008024987 A1 | 12/2008 |
| EP | 2051373 A1 | 4/2009 |
| WO | WO 02/41442 A1 | 5/2002 |

OTHER PUBLICATIONS

International Searching Authority, International Search Report and Written Opinion for International Application No. PCT/SE2011/050331, Nov. 24, 2011, 9 pages, Swedish Patent and Registration Office, Sweden.

(Continued)

*Primary Examiner* — Dinh Le  
(74) *Attorney, Agent, or Firm* — Alston & Bird LLP

(57) ABSTRACT

The present invention relates to a signal directing means for dividing or combining signals. It comprises a bottom row first port, a first row first and second port, and a bottom row signal connector. The signal directing means further comprises a first row first and second amplifier, each first row amplifier having a corresponding first and second terminal, said first terminals being connected along the bottom row signal connector. The signal directing means also comprises a first row signal connector, where said second terminals are connected along the first row signal connector. The second terminal of the first row first amplifier is connected to the first row first port and the second terminal of the first row second amplifier is connected to the first row second port. A plurality of second connector ports are also provided, with connecting impedances connecting between the respective ports.

12 Claims, 6 Drawing Sheets

(51) Int. Cl.
*H03F 3/60* (2006.01)
*H01P 5/16* (2006.01)

(56) References Cited

U.S. PATENT DOCUMENTS

| | | |
|---|---|---|
| 5,111,157 A | 5/1992 | Komiak |
| 5,166,640 A | 11/1992 | Fathimulla et al. |
| 6,215,360 B1 | 4/2001 | Callaway, Jr. |
| 6,769,380 B1 * | 8/2004 | Carvajalino et al. ......... 116/63 P |
| 7,724,091 B2 * | 5/2010 | Vickes et al. ................. 330/286 |
| 2008/0290948 A1 | 11/2008 | Fujii |

OTHER PUBLICATIONS

Safarian, Aminghasem, et al., "CMOS Distributed Active Power Combiners and Splitters for Multi-Antenna UWB Beamforming Transceivers," *IEEE Journal of Solid-State Circuits*, Jul. 2007, vol. 42, No. 7, pp. 1481-1491, USA.

Huang, Jing-Ying, et al., "A DC-20GHz CMOS Active Power Divider Design," Proceedings of the Asia-Pacific Microwave Conference 2010, WE3G-44, pp. 524-526, The Institute of Electronics, Information and Communication Engineers, Japan.

European Patent Office, Extended European Search Report for Application No. 11861586.3, Aug. 8, 2014, 4 pages, Germany.

* cited by examiner

SIGNAL DIRECTING MEANS FOR DIVIDING AN INPUT SIGNAL INTO AT LEAST TWO OUTPUT SIGNALS OR COMBINING AT LEAST TWO INPUT SIGNALS INTO ONE OUTPUT SIGNAL

CROSS REFERENCE TO RELATED APPLICATIONS

This application is a national stage application, filed under 35 U.S.C. §371, of International Application No. PCT/SE2011/050331, filed Mar. 24, 2011, the contents of which is hereby incorporated by reference in its entirety.

BACKGROUND

1. Related Field

The present invention relates to a signal directing means for dividing an input signal into at least two output signals or combining at least two input signals into one output signal, the signal directing means comprising a bottom row first port, a first row first port and a first row second port. The signal directing means further comprises a bottom row signal connector having a first end connected to the bottom row first port and a second end connected to a bottom row grounded termination impedance. The signal directing means further comprises a first row first amplifier and a first row second amplifier, each first row amplifier having a corresponding first terminal and second terminal, said first terminals being connected along the bottom row signal connector such that it is divided into connector parts.

2. Description of Related Art

Power dividers such as combiners and directional couplers constitute microwave components normally used for power division or power combining. In power division, an input signal is divided by the coupler into two or more signals of lesser power, and in power combining two or more signals are combined to an output signal of more power.

A power divider/combiner is often a three-port component with equal division, but more ports and/or unequal power division/combining ratios are also possible.

A wide variety of passive waveguide couplers and power dividers/combiners are available, originally E- and H-plane waveguide tee junctions, Bethe couplers, multihole directional couplers, waveguide magic-T:s, and various types of couplers using coaxial probes were developed. In the mid-1950s through the 1960s, many of these couplers were reinvented to use stripline or microstrip technology. The increasing use of planar structures for signal transmission also led to the development of new types of couplers and dividers, such as the Wilkinson divider, the branch line hybrid, and the coupled line directional coupler.

Power division and power combining are frequently used signal operations in microwave systems, especially in AESA-radar systems with its many T/R-modules.

When regarding passive power dividers/combiners, there are a number of drawbacks:

They are lossy, resulting in a net loss in the component.
They are generally narrow-banded, typically 10% to 20%.
Odd numbers of division or combining (3, 5, 7, . . . ) is difficult to obtain.
They require a relatively large area.

The document U.S. Pat. No. 4,769,618 discloses an active power divider or combiner comprising distributed amplifier components, such that a net gain is obtained.

However, it is desirable to obtain an active power divider or combiner that:

provides more gain,
is easier to make,
is more compact; and
has an enhanced gain-bandwidth product.

BRIEF SUMMARY

The object of the present invention it to provide an active power divider or combiner that, in relation to prior art, provides more gain, is easier to make, is more compact and has an enhanced gain-bandwidth product.

This object is achieved by means of a signal directing means for dividing an input signal into at least two output signals or combining at least two input signals into one output signal, the signal directing means comprising a bottom row first port, a first row first port and a first row second port. The signal directing means further comprises a bottom row signal connector having a first end connected to the bottom row first port and a second end connected to a bottom row grounded termination impedance. The signal directing means further comprises a first row first amplifier and a first row second amplifier, each first row amplifier having a corresponding first terminal and second terminal, said first terminals being connected along the bottom row signal connector such that it is divided into connector parts. Furthermore, the signal directing means comprises a first row signal connector having a first end connected to a first row first grounded termination impedance, where said second terminals are connected along the first row signal connector such that it is divided into connector parts. The second terminal of the first row first amplifier is connected to the first row first port and the second terminal of the first row second amplifier is connected to the first row second port, where top row ports each comprise a signal connector and a port terminal. Connecting impedances connect the top row ports, where the top row ports and the bottom row first port constitute input or output ports of the signal directing means.

According to an example, the signal directing means comprises a first row third amplifier where a first terminal of the first row third amplifier is connected along the bottom row signal connector and a second terminal of the first row third amplifier is connected to a first row third port.

According to another example, the first row signal connector has a second end which according to a first alternative is connected to a first row second grounded termination impedance and according to a second alternative is connected a first row end port, where the first row first port and the first row second port constitute top row ports, and where, in the case of the second alternative, the first row end port constitutes a top row port.

According to another example, the signal directing means comprises a second row first amplifier and a second row second amplifier, each second row amplifier having a corresponding first terminal and second terminal. The first row first port is connected to the first terminal of the second row first amplifier and the first row second port is connected to the first terminal of the second row second amplifier. The signal directing means further comprises a second row signal connector having a first end connected to a second row grounded termination impedance, where said second terminals, of the second row amplifiers are connected along the second row signal connector such that it is divided into connector parts. The second terminal of the second row first amplifier is connected to a second row first port and the second terminal of the second row second amplifier is connected to a second row second port.

Furthermore, the signal directing means may comprise a second row third amplifier, where a first terminal of the second row third amplifier is connected to the first row third port and a second terminal of the second row third amplifier is connected to a second row third port.

A first signal directing means, a second signal directing means, a third signal directing means and a fourth signal directing means may constitute modules that are connected in a cascade connection to acquire a desired power division ratio.

A number of advantages is obtained by means of the present invention; for example

- Equal and non-equal power division and combining is possible.
- Tapering of amplification or gain is possible.
- Even and odd order power division and combining is possible.
- Broadband frequency performance. More than an octave bandwidth is possible at microwave frequencies.
- By using two general modules, "active 4-way power divider" and "active 4-way power combiner", in different cascade connections, any combining/division ratio N can be achieved, where N can any integer value.
- The power consumption is typical <80 mW per module.
- Small area, typical 2×2 mm$^2$ per module. Each module can for example be put into a QFN-package.

BRIEF DESCRIPTION OF THE FIGURES

The present invention will now be described more in detail with reference to the appended drawings, where.

DETAILED DESCRIPTION OF VARIOUS EMBODIMENTS

Figure 1:
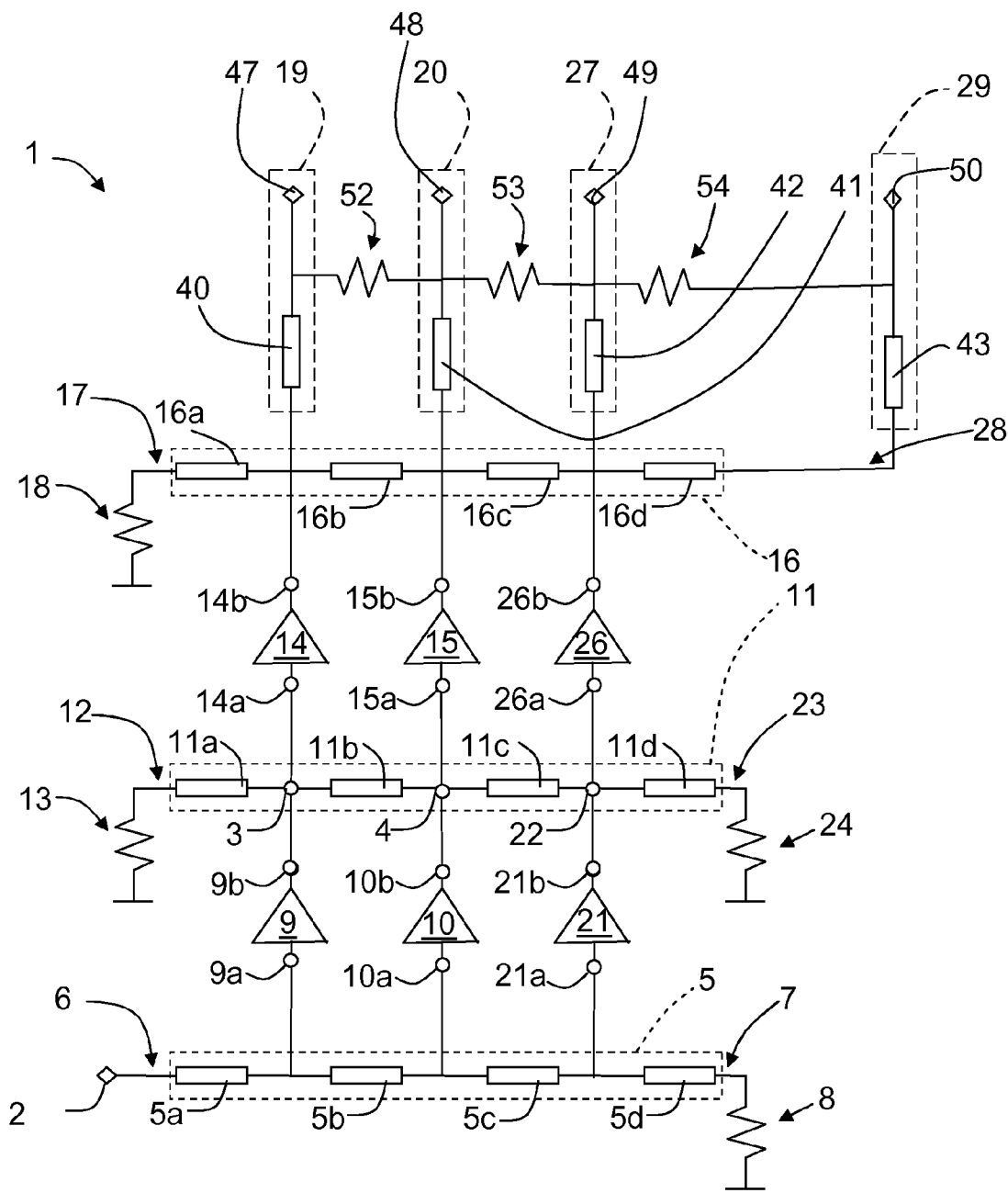
FIG. 1 shows a first example of a power divider according to the present invention.

With reference to FIG. 1, a first example of a power divider 1 for dividing an input signal into four output signals is shown. The power divider 1 comprises a bottom row first port 2, a first row first port 3, a first row second port 4 and a first row third port 22. The power divider 1 further comprises a bottom row signal connector 5 having a first end 6 connected to the bottom row first port 2 and a second end 7 connected to a bottom row grounded termination impedance 8.

The power divider 1 further comprises a first row first amplifier 9 a first row second amplifier 10 and a first row third amplifier 21, each first row amplifier 9, 10, 21 having a corresponding first terminal 9a, 10a, 21a and second terminal 9b, 10b, 21b, said first terminals 9a, 10a, 21a being connected along the bottom row signal connector 5 such that it is divided into four connector parts 5a, 5b, 5c, 5d.

According to the present invention, the power divider 1 comprises a first row signal connector 11 having a first end 12 connected to a first row first grounded termination impedance 13 and a second end 23 connected to a first row second grounded termination impedance 13. Said second terminals 9b, 10b, 21b are connected along the first row signal connector 11 such that it is divided into four connector parts 11a, 11b, 11c, 11d, where furthermore the second terminal 9b of the first row first amplifier 9 is connected to the first row first port 3, the second terminal 10b of the first row second amplifier 10 is connected to the first row second port 4 and the second terminal 21b of the first row third amplifier 21 is connected to the first row third port 22.

Furthermore, the power divider 1 comprises a second row first amplifier 14, a second row second amplifier 15, and a second row third amplifier 26, each second row amplifier 14, 15, 26 having a corresponding first terminal 14a, 15a, 26a and second terminal 14b, 15b, 21b. The bottom row first port 2 is an input port of the power divider 1, and the first row first port 3 is connected to the first terminal 14a of the second row first amplifier 14, the first row second port 4 is connected to the first terminal 15a of the second row second amplifier 15 and the first terminal 26a of the second row third amplifier 26 is connected to the first row third port 22.

The power divider 1 further comprises a second row signal connector 16 having a first end 17 connected to a second row grounded termination impedance 18, where said second terminals 14b, 15b, 26b of the second row amplifiers 14, 15, 26 are connected along the second row signal connector 16 such that it is divided into four connector parts 16a, 16b, 16c, 16d.

The second terminal 14b of the second row first amplifier 14 is connected to a signal connector 40 comprised in a second row first port 19, the second terminal 15b of the second row second amplifier 15 is connected to a signal connector 41 comprised in a second row second port 20 and the second terminal 26b of the second row third amplifier 26 is connected to a signal connector 42 comprised in a second row third port 27. The second row signal connector 16 has a second end 28 connected to a signal connector 43 comprised in a second row end port 29. All amplifier first terminals 9a, 10a, 21a; 14a, 15a, 26a constitute amplifier input ports, and all amplifier second terminals 9b, 10b, 21b; 14b, 15b, 26b constitute amplifier output ports, The second row ports 19, 20, 27, 29 constitute output ports of the power divider 1, and as such also constitutes top row ports, the second row being the top row in this example. Each second row port 19, 20, 27, 29 also comprises a corresponding port terminal 47, 48, 49, 50, where, for each second row port 19, 20, 27, 29, the signal connector 40, 41, 42, 43 is connected to the corresponding port terminal 47, 48, 49, 50. The port terminals are connected by means of connecting impedances 52, 53, 54, such between the port terminal 47 of the second row first port 19 and the port terminal 48 of the second row second port 20 there is a first connecting impedance 52; between the port terminal 48 of the second row second port 20 and the port terminal 49 of the second row third port 27 there is a second connecting impedance 53; and between the port terminal 49 of the second row third port 27 and the port terminal 50 of the second row end port 29 there is a third connecting impedance 54.

The power divider 1 thus constitutes an active four-way power divider 1 with amplification, having five RF-ports 2, 19, 20, 27, 29 in total, where four ports 19, 20, 27, 29 are arranged for output power and one port 2 is arranged for for input power. This means that all signal levels at the four output ports 19, 20, 27, 29 are higher compared to the signal level at the input port 2. The signal is amplified through a circuit arrangement comprising of six amplifiers 9, 10, 21; 14, 15, 26. Each output port 19, 20, 27, 29 has a corresponding amplification G1, G2, G3, G4, where, each corresponding output power P2, P3, P4, P5 equals the amplification G1, G2, G3, G4 times the input power P1.

The amplifications G1, G2, G3, G4 may be set to be equal as well as being not equal.

The power divider 1 can be used as a module in various cascade connections to acquire a desired power division ratio N, where N can have any integer number, even or odd.

Figure 2:
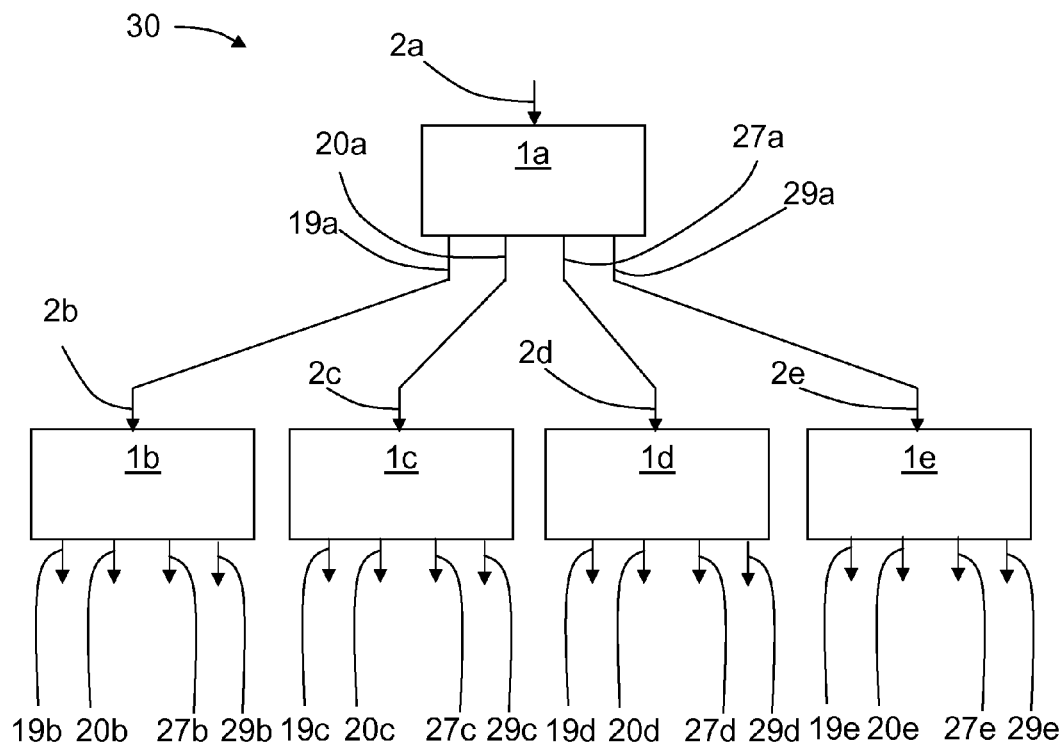
FIG. 2 shows a second example of a power divider according to the present invention.

With reference to FIG. 2, a 16-way power divider 30 is shown, comprising a first power divider 1a, having an input port 2a, and four output ports 19a, 20a, 27a, 29a. The 16-way power divider 30 further comprises a second power divider 1b, a third power divider 1c, a fourth power divider 1d and a fifth power divider 1e, where the first output port 19a of the first power divider 1a is connected to an input port 2b of the second power divider 1b, the second output port 20a of the first power divider 1a is connected to an input port 2c of the third power divider 1c, the third output port 27a of the first power divider 1a is connected to an input port 2d of the fourth power divider 1d, and where the fourth output port 29a of the first power divider 1a is connected to an input port 2e of the fifth power divider 1e.

Each of the second power divider 1b, the third power divider 1c, the fourth power divider 1d and the fifth power divider 1e comprises four output ports 19b, 20b, 27b, 29b; 19c, 20c, 27c, 29c; 19d, 20d, 27d, 29; 19e, 20e, 27e, 29e. In this way, a total of sixteen output ports 19b, 20b, 27b, 29b; 19c, 20c, 27c, 29c; 19d, 20d, 27d, 29d; 19e, 20c, 27e, 29e is obtained.

Figure 3:
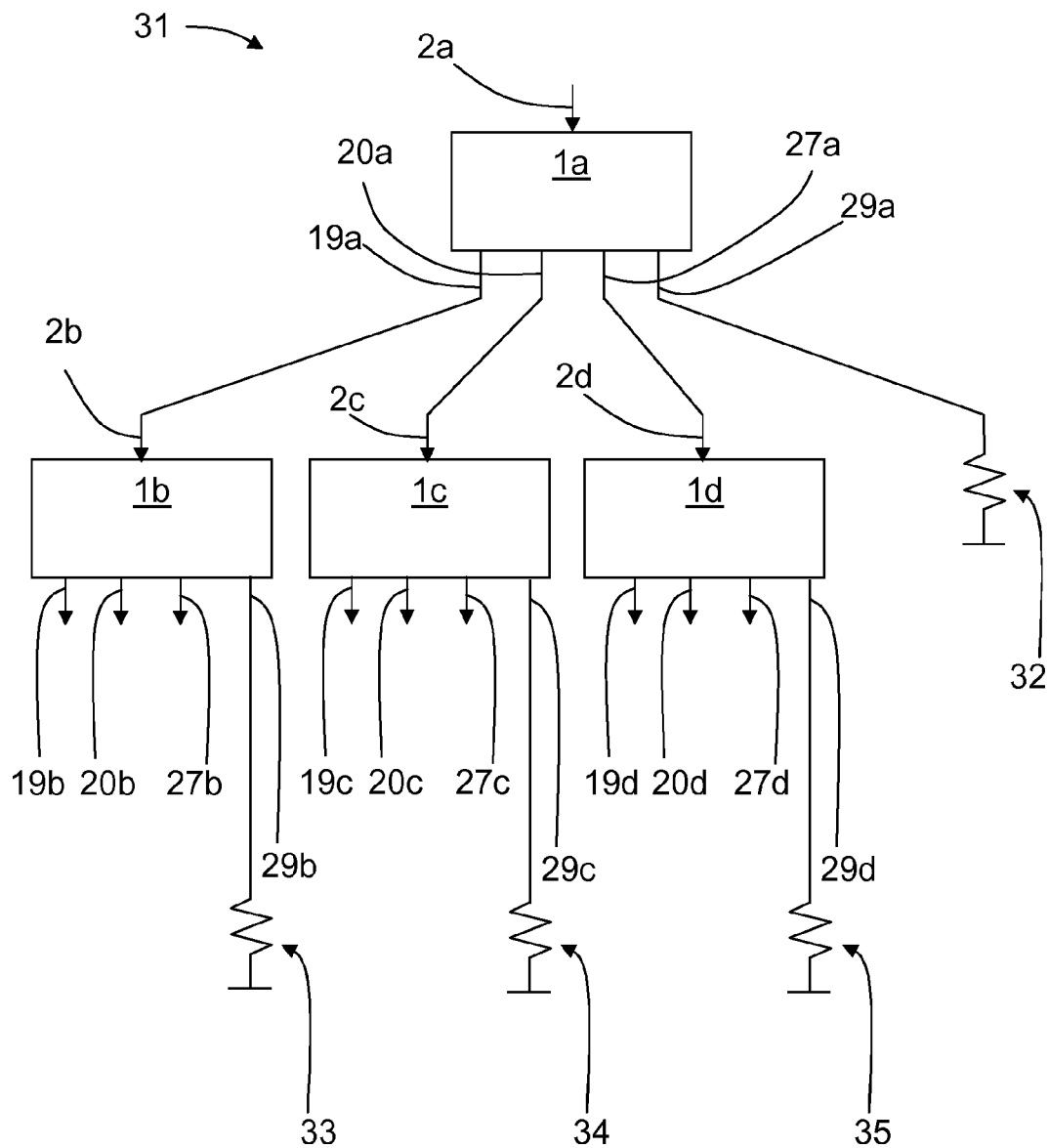
FIG. 3 shows a third example of a power divider according to the present invention.

By connecting output ports to grounded termination impedances, any number of output ports may be obtained. This is shown in a third example with reference to FIG. 3, showing a 9-way power divider 31. The 9-way power divider 31 comprises the first power divider 1a, the second power divider 1b, the third power divider 1c and the fourth power divider 1d from the previous example.

For the 9-way power divider 31, all fourth output ports 29a, 29b, 29c, 29d of the power dividers 1a, 1b, 1c, 1d are connected to corresponding termination impedance 32, 33, 34, 35. All other connections are the same as in the previous example. In this way, only nine output ports remain.

Of course, the number of output ports terminated may vary, and the number of power divider modules used in cascade connections may vary, such that at large number of different power dividers may be obtained; the ones discussed above are only examples of how cascaded connections may be made. Furthermore, the blocks have as described only been constituted by 4-way power dividers.

Other types of power dividers are also possible, and examples of these are going to discussed in the following.

Figure 4:
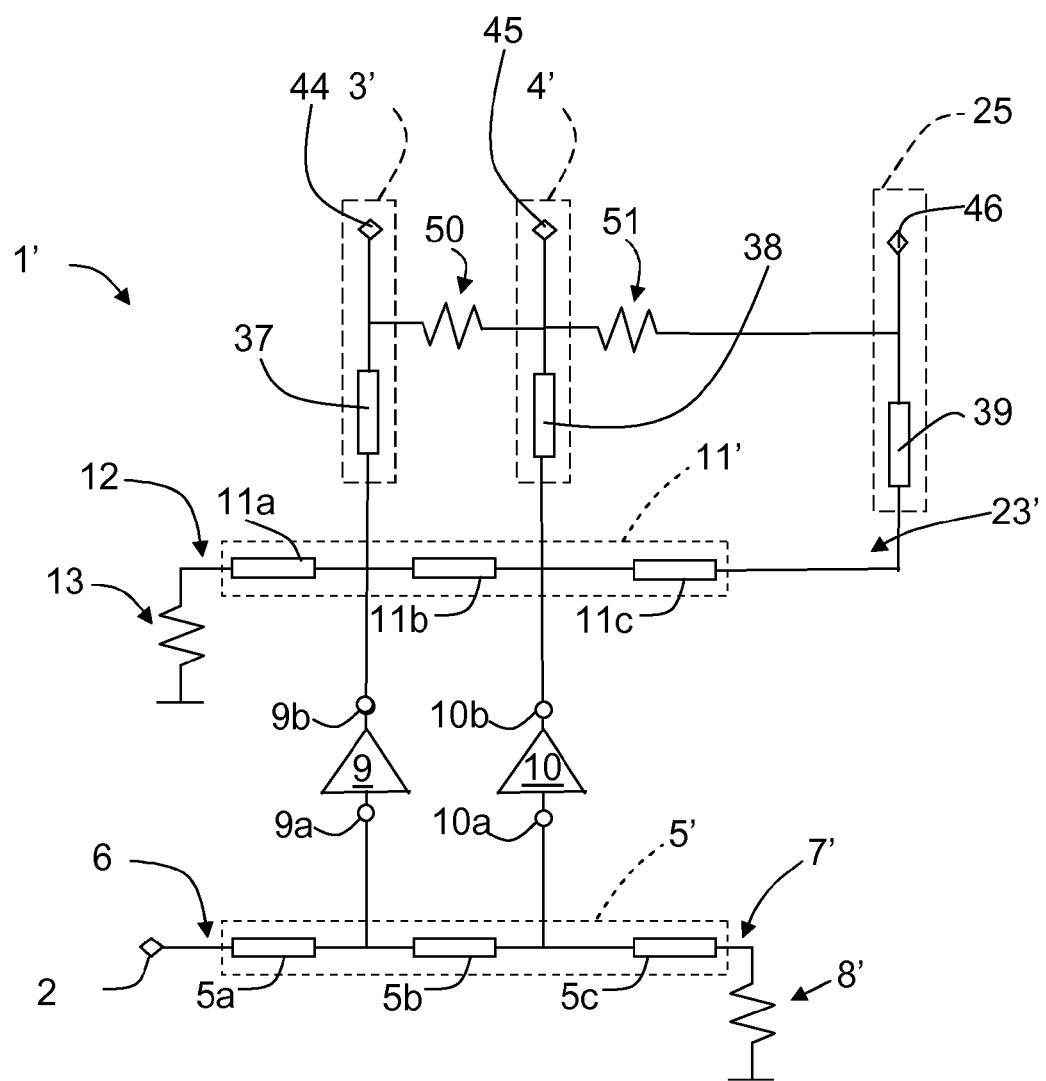
FIG. 4 shows a fourth example of a power divider according to the present invention.

With reference to FIG. 4, a fourth example of a power divider 1' is shown. The power divider 1' comprises the bottom row first port 2, the first row first port 3', and the first row second port 4' from the first example. The power divider 1' further comprises the bottom row signal connector 5' having a first end 6 connected to the bottom row first port 2 and a second end 7' connected to a bottom row grounded termination impedance 8'.

The power divider 1' further comprises the first row first amplifier 9 and the first row second amplifier 10 with the corresponding first terminals 9a, 10a, and second terminals 9b, 10b. The first terminals 9a, 10a are connected along the bottom row signal connector 5' such that it is divided into three connector parts 5a, 5b, 5c.

The power divider 1' also comprises a first row signal connector 11' having a first end 12 connected to a first row first grounded termination impedance 13. The second terminals 9b, 10b are connected along the first row signal connector 11' such that it is divided into three connector parts 11a, 11b, 11c. The second terminal 9b of the first row first amplifier 9 is connected to a signal connector 37 comprised in the first row first port 3', the second terminal 10b of the first row second amplifier 10 is connected to a signal connector 38 comprised in the first row second port 4'. Furthermore, a second end 23' of the first row signal connector 11' is connected to a signal connector 39 comprised in first row end port 25.

The first row ports 3', 4', 25 constitute output ports of the power divider 1', and as such also constitutes top row ports, the first row being the top row in this example. Each first row port 3', 4', 25 also comprises a corresponding port terminal 44, 45, 46, where, for each first row port 3', 4', 25, the signal connector 37, 38, 39 is connected to the corresponding port terminal 44, 45, 46. The port terminals 44, 45, 46 are connected by means of connecting impedances 50, 51, such between the port terminal 44 of the first row first port 3' and the port terminal 45 of the first row second port 4' there is a first connecting impedance 50; and between the port terminal 45 of the first row second port 4' and the port terminal 46 of the first row end port 25 there is a second connecting impedance 51.

The power divider 1' according to this fourth example thus constitutes a 3-way power divider.

Figure 5:
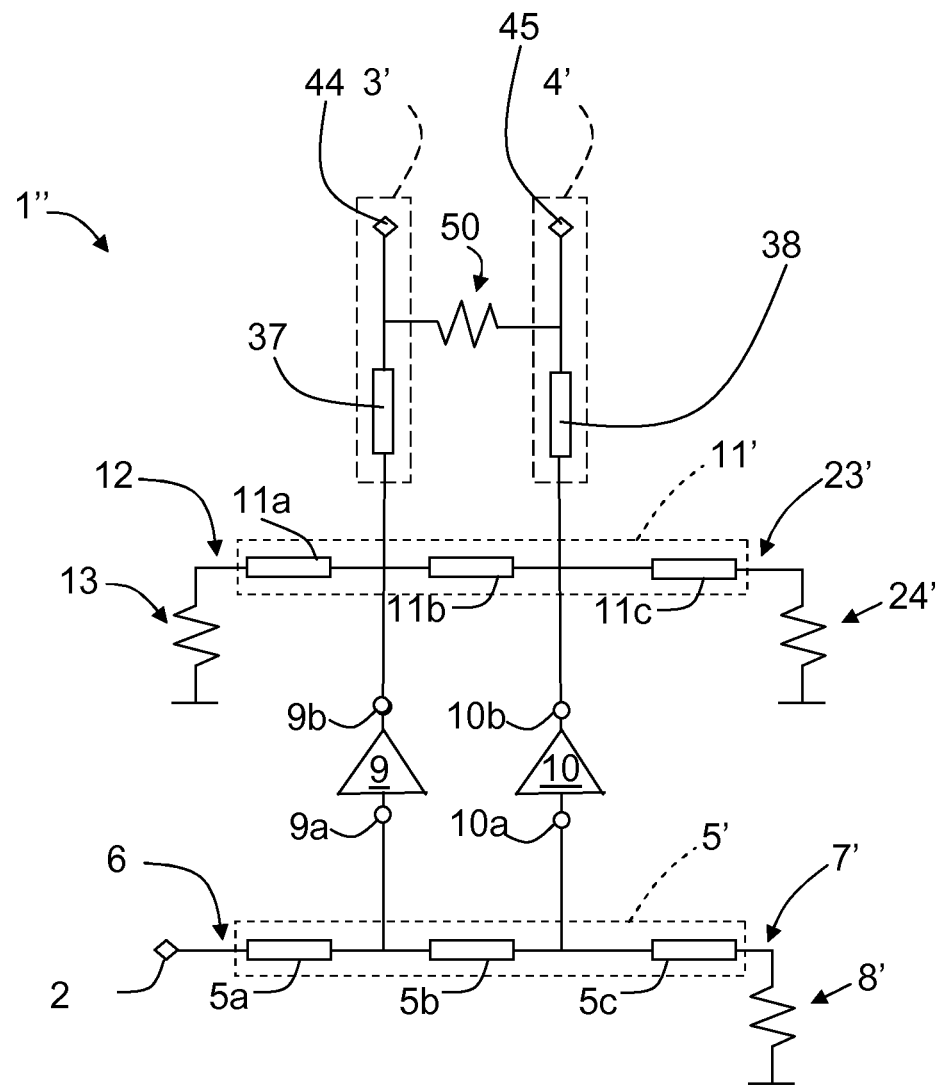
FIG. 5 shows a fifth example of a power divider according to the present invention.

With reference to FIG. 5, a fifth example of a power divider 1" is shown. In this example, the power divider 1" is identical to the one in the previous example but for the absence of the first row end port 25. Instead, a first row second grounded termination impedance 24' is connected to the second end 23' of the first row signal connector 11'.

The power divider 1" according to this example thus constitutes a 2-way power divider.

In the same way, the second row end port 29 of the first example could be changed to a second row second grounded termination impedance (not shown) which would turn the 4-way power divider of the first example to a 3-way power divider.

The present invention also relates to a power combiner. In all examples of the present invention, described or only implicitly following from the general concept of the present invention, the amplifiers are changed such that inputs and outputs change places. This leads to that the input ports and the output ports also changes.

Figure 6:
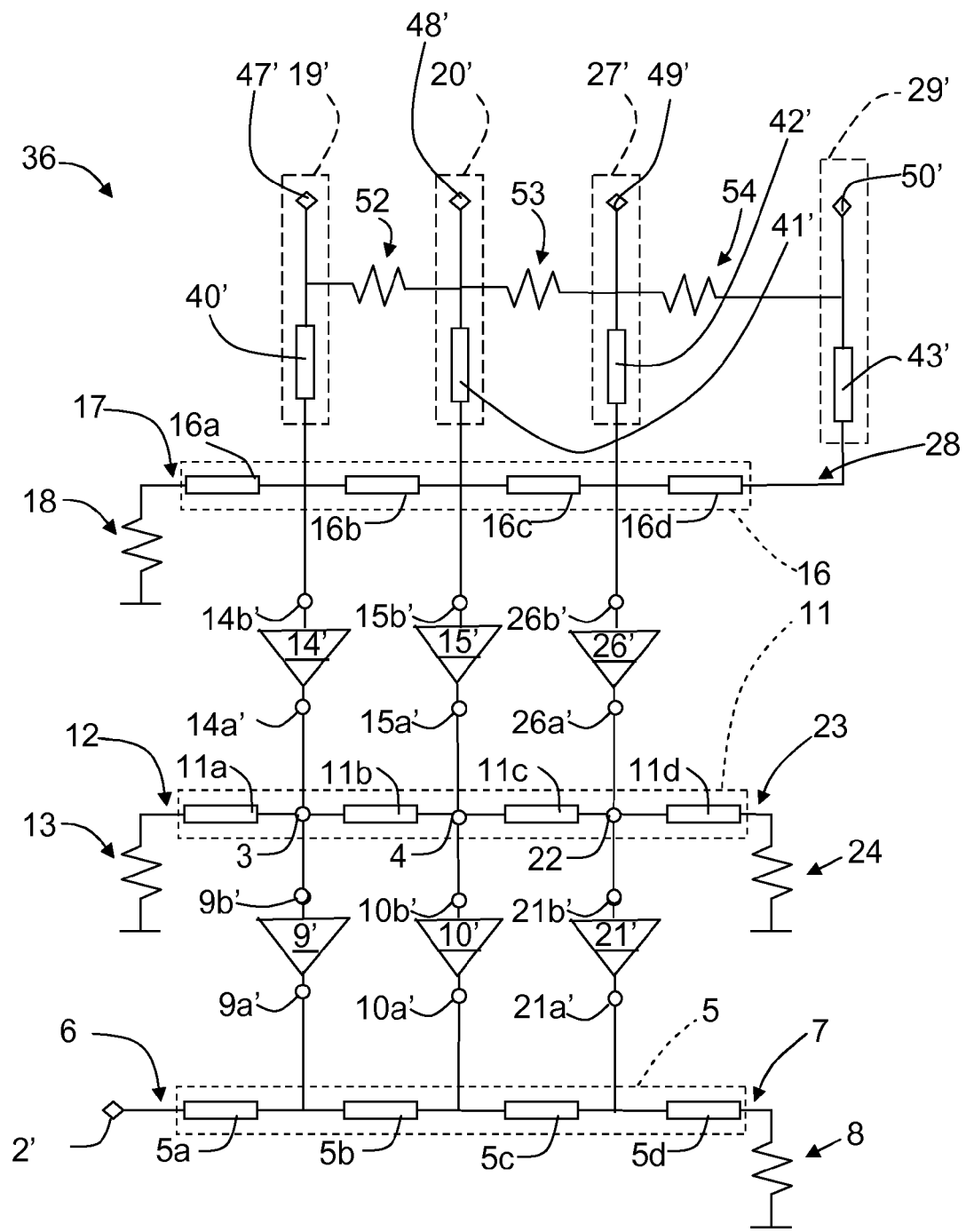
FIG. 6 shows an example of a power combiner according to the present invention.

This is shown in a sixth example with reference to FIG. 6, where the amplifiers and their respective ports have been turned, the input ports and the output ports changing places. Mainly the differences between this example and the first example with reference to FIG. 1 are discussed in the following, where the differences in question changes the power divider to a power combiner 36.

Thus in this example the power combiner 36 comprises a bottom row first port 2' which constitutes an output port of the power combiner 36.

The power combiner 36 further comprises a first row first amplifier 9' a first row second amplifier 10' and a first row third amplifier 21', each first row amplifier 9', 10', 21' having a corresponding first terminal 9a', 10a', 21a' and second terminal 9b', 10b', 21b', said first terminals 9a', 10a', 21a' being connected along the bottom row signal connector 5 such that it is divided into four connector parts 5a, 5b, 5c, 5d.

The second terminals 9b', 10b', 21b' are connected along the first row signal connector 11 such that it is divided into four connector parts 11a, 11b, 11c, 11d, where furthermore the second terminal 9b' of the first row first amplifier 9' is connected to the first row first port 3, the second terminal 10b' of the first row second amplifier 10' is connected to the first row second port 4 and the second terminal 21b' of the first row third amplifier 21' is connected to the first row third port 22.

Furthermore, the power combiner 36 comprises a second row first amplifier 14', a second row second amplifier 15', and a second row third amplifier 26', each second row amplifier 14', 15', 26' having a corresponding first terminal 14a', 15a', 26a' and second terminal 14b', 15b', 21b'. The first row first port 3 is connected to the first terminal 14a' of the second row first amplifier 14, the first row second port 4 is connected to the first terminal 15a' of the second row second amplifier 15 and the first terminal 26a' of the second row third amplifier 26' is connected to the first row third port 22.

The second terminals 14b', 15b', 26b' of the second row amplifiers 14', 15', 26' are connected along the second row signal connector 16 such that it is divided into four connector parts 16a, 16b, 16c, 16d.

The first terminal 14b' of the second row first amplifier 14' is connected to a signal connector 40' comprised in a second row first port 19', the second terminal 15b' of the second row second amplifier 15' is connected to a signal connector 41' comprised in a second row second port 20' and the second terminal 26b' of the second row third amplifier 26' is connected to a signal connector 42' comprised in a second row third port 27'. The second row signal connector 16 has a second end 28 connected to a signal connector 43' comprised in a second row end port 29'.

The second row ports 19', 20', 27', 29' constitute input ports of the power combiner 36, and as such also constitutes top row ports, the second row being the top row in this example. In the same way as in the first example, each second row port 19', 20', 27', 29' also comprises a corresponding port terminal 47', 48', 49', 50', where, for each second row port 19', 20', 27', 29', the signal connector 40', 41', 42', 43' is connected to the corresponding port terminal 47', 48', 49', 50'. In the same way as in the first example, the port terminals 47', 48', 49', 50' are connected by means of connecting impedances 52, 53, 54, In this example, all amplifier first terminals 9a', 10a', 21a'; 14a', 15a', 26a' constitute amplifier output ports, and all amplifier second terminals 9b', 10b', 21b'; 14b', 15b', 26b' constitute amplifier output ports.

For all examples within the scope of the present invention, the present invention relates to a power combiner 36 as well as it relates to a power divider 1, and generally relates to a power directing means. It is for example evident that in the examples with references to FIG. 2-5 a power combiner may be used instead. Thus, for example, the power divider modules 1a, 1b, 1c, 1d, 1e in FIGS. 2 and 3 may be constituted by power combiners instead.

The present invention is not limited to the examples described above, but may vary freely within the scope of the appended claims. For example, each amplifier may be constituted by any number of transistors or alike any any suitable configuration Any type of signal direction means according to the present invention may be used as a module in various cascade connections to acquire a desiredpower division ratio N, as described previously.

The power directing means 1, 1', 1", 36 described have either comprised one row with two amplifiers, or two rows with three amplifiers, where terminations and ports have been described to be possible to exchange in order to change the number of ports. Furthermore, many other configurations are possible, where each row at least comprises at least two amplifiers, and where the power directing means 1, 1', 1", 36 comprises at least one row of amplifiers.

The signal connectors 5, 11, 16; 5', 11' and the corresponding connector parts mentioned are of any suitable type, for example microstrip or stripline transmission lines or coaxial conductors.

The invention claimed is:

1. A signal directing means for dividing an input signal into at least two output signals or combining at least two input signals into one output signal, the signal directing means comprising:
   a bottom row first port;
   a first row first port and a first row second port;
   a bottom row signal connector having a first end connected to the bottom row first port and a second end connected to a bottom row grounded termination impedance;
   a first row first amplifier and a first row second amplifier, each first row amplifier having a corresponding first terminal and a corresponding second terminal, each of said corresponding first terminals being connected along the bottom row signal connector such that it is divided into connector parts; and
   a first row signal connector having a first end connected to a first row first grounded termination impedance and a second end connected to a second row second grounded termination impedance,
   wherein:
   each of said corresponding second terminals is connected along the first row signal connector such that the signal directing means is divided into connector parts;
   a first set of the corresponding second terminals of the first row first amplifier is connected to the first row first port;
   a second set of the corresponding second terminals of the first row second amplifier is connected to the first row second port;
   a top row port signal connector comprising a plurality of first connector ports, one end connector port connected to a third grounded termination impedance and another two connector ports coupled to the first row first port and the first row second port;
   a plurality of second connector ports, each connecting a respective first connector port of the top row signal connector to a respective output port;
   connecting impedances connect between the respective ports; and
   the respective output ports the first row ports and the bottom row first port constitute input or output ports of the signal directing means.

2. A signal directing means according to claim 1, wherein:
   the signal directing means further comprises a first row third amplifier;
   a first terminal of the first row third amplifier is connected along the bottom row signal connector; and
   a second terminal of the first row third amplifier is connected to a first row third port.

3. A signal directing means according to claim 1, wherein the first row first port and the first row second port constitute top row ports.

4. A signal directing means according to claim 1, wherein:
   the first row signal connector has a second end, which is connected to at least one of a first row second grounded termination impedance or a first row end port; and
   the first row first port and the first row second port constitute top row ports.

5. A signal directing means according to claim 4, wherein:
   the first row signal connector has a second end, which is connected to a first row end port; and
   the first row end port constitutes a top row port.

6. A signal directing means according to claim 1, wherein the signal directing means comprises:

a second row first amplifier and a second row second amplifier, each second row amplifier having a corresponding first terminal and second terminal, where the first row first port is connected to the first terminal of the second row first amplifier and the first row second port is connected to the first terminal of the second row second amplifier; and a second row signal connector having a first end connected to a second row grounded termination impedance, where said second terminals, of the second row amplifiers are connected along the second row signal connector such that it is divided into connector parts, where furthermore the second terminal of the second row first amplifier is connected to a second row first port and the second terminal of the second row second amplifier is connected to a second row second port.

7. A signal directing means according to claim 2, wherein the signal directing means comprises:

a second row first amplifier and a second row second amplifier, each second row amplifier having a corresponding first terminal and second terminal, where the first row first port is connected to the first terminal of the second row first amplifier and the first row second port is connected to the first terminal of the second row second amplifier;

a second row signal connector having a first end connected to a second row grounded termination impedance, where said second terminals, of the second row amplifiers are connected along the second row signal connector such that it is divided into connector parts, where furthermore the second terminal of the second row first amplifier is connected to a second row first port and the second terminal of the second row second amplifier is connected to a second row second port; and a second row third amplifier where a first terminal of the second row third amplifier is connected to the first row third port and a second terminal of the second row third amplifier is connected to a second row third port.

8. A signal directing means according to claim 6, wherein:
the second row signal connector has a second end connected to a second row end port; and
the second row first port, the second row second port, the second row third port and the second row end port constitute top row ports.

9. A signal directing means according to claim 1, wherein:
the signal directing means comprise a first signal directing means, a second signal directing means, a third signal directing means, and a fourth signal directing means; and
said first signal directing means, said second signal directing means, said third signal directing means, and said fourth signal directing means constitute respective modules that are connected relative to one another in a cascade connection so as to acquire a desired power division ratio.

10. A signal directing means according to claim 9, wherein the first signal directing means comprises an input port, and four output ports, where a first output port of the first signal directing means is connected to an input port of the second signal directing means, a second output port of the first signal directing means is connected to an input port of the third signal directing means and a third output port of the first power divider is connected to an input port of the fourth signal directing means.

11. A signal directing means according to claim 10, wherein a fourth output port of the first signal directing means is connected to a grounded termination impedance.

12. A signal directing means according to claim 10, wherein a fourth output port of the first signal directing means is connected to an input port of a fifth signal directing means.

* * * * *

UNITED STATES PATENT AND TRADEMARK OFFICE
CERTIFICATE OF CORRECTION

| | | |
|---|---|---|
| PATENT NO. | : 9,024,703 B2 | Page 1 of 1 |
| APPLICATION NO. | : 14/006067 | |
| DATED | : May 5, 2015 | |
| INVENTOR(S) | : Ferndahl et al. | |

It is certified that error appears in the above-identified patent and that said Letters Patent is hereby corrected as shown below:

In the claims

Column 8

Line 43, delete "ports the first row"

Signed and Sealed this
Sixth Day of October, 2015

Michelle K. Lee
*Director of the United States Patent and Trademark Office*